United States Patent
Wang

(10) Patent No.: US 8,709,859 B2
(45) Date of Patent: Apr. 29, 2014

(54) METHOD FOR FABRICATING SOLAR CELL

(71) Applicant: GAMC Biotech Development Co., Ltd., New Taipei (TW)

(72) Inventor: Chia-Gee Wang, New York, NY (US)

(73) Assignee: GAMC Biotech Development Co., Ltd., New Taipei (TW)

( * ) Notice: Subject to any disclaimer, the term of this patent is extended or adjusted under 35 U.S.C. 154(b) by 0 days.

(21) Appl. No.: 13/756,541

(22) Filed: Feb. 1, 2013

(65) Prior Publication Data

US 2013/0203212 A1     Aug. 8, 2013

Related U.S. Application Data

(60) Provisional application No. 61/594,645, filed on Feb. 3, 2012, provisional application No. 61/602,114, filed on Feb. 23, 2012, provisional application No. 61/608,046, filed on Mar. 7, 2012.

(51) Int. Cl.
*H01L 21/00*     (2006.01)

(52) U.S. Cl.
USPC ................ 438/93; 438/61; 257/615; 257/431

(58) Field of Classification Search
USPC ...................... 257/189, 615, E33.023; 438/93
See application file for complete search history.

(56) References Cited

U.S. PATENT DOCUMENTS

| | | | | |
|---|---|---|---|---|
| 4,323,419 A | * | 4/1982 | Wakefield | ........................ 438/62 |
| 4,365,107 A | * | 12/1982 | Yamauchi | ............. 257/E31.042 |
| 5,516,283 A | * | 5/1996 | Schrems | ........................ 432/241 |

* cited by examiner

*Primary Examiner* — Charles Garber
*Assistant Examiner* — Alia Sabur
(74) *Attorney, Agent, or Firm* — Jianq Chyun IP Office

(57) ABSTRACT

A method of fabricating a solar cell on a conveyer belt is provided. The method includes the following steps. A first surface of an aluminum foil is coated with a layer of phosphorous mixed with a plurality of graphite powders and put on the conveyer belt. A first thermal treatment is performed to activate a portion of the aluminum foil and the phosphorous layer on the first surface to form an aluminum phosphide (AlP) layer. A molten silicon material is spray-coated on a second surface of the remaining aluminum foil, and a second thermal treatment is performed to make the silicon material transferring into a p-type polySi layer on the n-type AlP layer. A solar cell including the n-type AlP layer and the p-type polySi layer is formed, and the solar cell is respectively annealed and cooled down in a first and a second vertical stack.

15 Claims, 6 Drawing Sheets

METHOD FOR FABRICATING SOLAR CELL

CROSS-REFERENCE TO RELATED APPLICATION

This application claims the priority benefits of U.S. provisional applications Ser. No. 61/594,645, filed on Feb. 3, 2012, Ser. No. 61/602,114, filed on Feb. 23, 2012, and Ser. No. 61/608,046, filed on Mar. 7, 2012. The entirety of each of the above-mentioned patent applications is hereby incorporated by reference herein and made a part of this specification.

BACKGROUND OF THE INVENTION

1. Field of the Invention

The present invention is related to a fabrication method of a solar cell, and more particularly, to a method of fabricating a solar cell on a continuously moving conveyer belt.

2. Description of Related Art

A solar cell, or a solar photovoltaic (PV) cell, is used to transfer the solar energy into electric power. Since the solar energy refers to clean, pollution-free and inexhaustible energy, the solar cell plays an important role in applying solar energy. Based on such condition, research and development factories are devoted in producing low cost solar cells with relatively high efficiency.

Solar cells are mostly made of semiconductor materials, such as silicon (Si), or compounds like copper indium gallium selenide (CIGS), and so on. Taking the low cost leader polysilicon (polySi) solar cell as an example, more than half of the production cost on manufacturing the solar cells is spent on the polySi substrate material. However, in traditional manufacturing process, a large portion of the polySi material is wasted during fabrication by slicing a thin substrate and polishing from a polySi boule. More sufficiently utilizing the polySi material to fabricate solar cells is therefore an obvious topic for R and D people skilled in the art, and for which this disclosure is dedicated.

SUMMARY OF THE INVENTION

The present invention is directed to a method of fabricating a solar cell in order to reduce cost by sufficiently utilizing the semiconductor material for fabricating the solar cell.

An exemplary embodiment of the present invention including a method of fabricating a solar cell on a conveyer belt. In the method, a first surface of an aluminum foil is coated with a layer of phosphorous (P), especially a red phosphorous (rP), mixed with a plurality of fine graphite powders. The aluminum foil with the rP layer and the graphite powders is put on the conveyer belt. A first thermal treatment is performed to activate the rP to react with a portion of the aluminum foil to form a self-limiting Aluminum Phosphide (AlP) on the first surface, and will form an n-type aluminum phosphide (AlP) layer with the activated Si as dopant in the subsequent steps, where a portion of the aluminum foil not reacted with the phosphorous layer is remained on the conveyer belt. A molten silicon material including boron (B) is spray-coated on a second surface of the remaining aluminum foil, where the second surface is opposite to the first surface. The molten Si is spray-coated on Al and forms a polySi layer which absorbs much of the remaining Al not participated in the self-limiting formation of the AlP compound. A second thermal treatment is performed for the silicon layer utilizing the B as the p-dopant, and the Al as the additional p-dopant for the p-type polySi layer on the n-type AlP layer with Si replacing Al as the n-dopant. That is, by activating the rP in the first thermal treatment, the self-limiting substrate AlP is formed. By spray-coating the molten silicon on the Al/AlP substrate as another thermal treatment, the remaining Al is merged into the Si material while the AlP becomes n-type with Si as the n-dopant. In the second thermal treatment, it is performed to stabilize the formation of p-type polySi layer on the n-type AlP layer in an inert gas and annealing the p-type polySi layer with $H_2$ gas to reduce the dangling bonds in the polySi grain boundaries. Therefore, a solar cell including the p-type polySi layer and the n-type wide bandgap, ultra-thin uniform AlP layer together with the anti-reflective graphite power coating is formed on the conveyer belt. The solar cell is annealed in hydrogen by entering the solar cell into an annealing column and ascending the solar cells by stacking upward sequentially in a first vertical stack in the annealing column. The solar cell is transferred at top into a second vertical stack for cooling from the annealing column to descend from top to bottom to return to the conveyer belt.

According to an exemplary embodiment of the present invention, the step of putting the aluminum foil with the rP layer on the conveyer belt and the step of spraying molten silicon material on the remaining aluminum foil further include using an entry tray to support the aluminum foil on the conveyer belt, where the solar cell is formed in the entry tray.

According to an exemplary embodiment of the present invention, the entry tray is coated with a plurality of graphite powders, and the surface coated with the red phosphorous layer mixed with the graphite powders is faced to the entry tray.

According to an exemplary embodiment of the present invention, the first thermal treatment includes heating the aluminum foil and the rP layer at 300° C.

According to an exemplary embodiment of the present invention, a silicon material is heated to 1500° C. as the molten silicon material, and the molten silicon material is spray-coated on the second surface of the aluminum layer before entering the second thermal treatment. The second thermal treatment includes following steps. The remaining aluminum foil is melted to merge into the silicon material as the additional p-dopant at 660° C. The silicon material incorporating Al as the p-type polySi layer on the AlP substrate is heated at 900° C. to anneal the p-type polySi layer.

According to an exemplary embodiment of the present invention, the n-type AlP layer is formed by using the silicon as an n-dopant.

According to an exemplary embodiment of the present invention, a material to form the AlP substrate layer includes Al foil and red phosphorous powders.

According to an exemplary embodiment of the present invention, the step of annealing the solar cell is performed at a range of 900° C.-1000° C.

According to an exemplary embodiment of the present invention, after the step of transfering the solar cell from the annealing column into the second vertical stack, the method of fabricating the solar cell further includes following steps. A plurality of digital electrodes is attached to an exposed surface of the n-type AlP layer. The digital electrodes and the n-type AlP layer are sealed with a bonding glass.

According to an exemplary embodiment of the present invention, the digital electrodes are imprinted on a separable waxy surface.

According to an exemplary embodiment of the present invention, a material of the digital electrodes includes nickel.

According to an exemplary embodiment of the present invention, the digital electrodes are formed by a conductive ink in an ink jet printing material which is printed on the separable waxy surface.

According to an exemplary embodiment of the present invention, after the step of sealing the digital electrodes and the n-type AlP layer, the method of fabricating the solar cell further includes the following step. A reflective metal back layer is added to an exposed surface of the p-type polySi layer.

According to an exemplary embodiment of the present invention, the reflective metal back layer includes an aluminum layer.

According to an exemplary embodiment of the present invention, the solar cell is sealed in a stainless steel or an aluminium alloy well covered by a flat bonding glass.

Based on the above, according to the exemplary embodiments, the solar cell is formed layer-by-layer. By providing various materials and consecutively applying the first thermal treatment and the second thermal treatment to form the n-type AlP layer and the p-type polySi layer, the method can sufficiently utilize the material since most of the functional PV material are involved in the fabrication process to form the solar cell. Further, the fabrication method is performed on a moving conveyer belt, so that the effective instrument throughput is increased by avoiding stoppings the conveyer belt to move the partially finished or finished solar cells.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
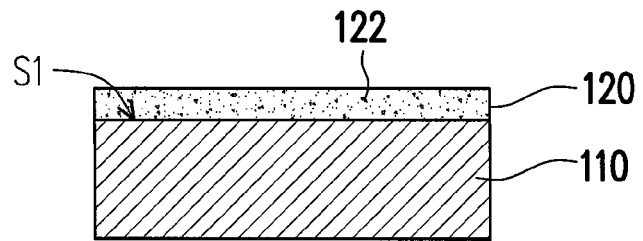
FIG. 1A to FIG. 1I illustrating a method of fabricating a solar cell according to an exemplary embodiment of the present invention.

Descriptions of the invention are given with reference to the exemplary embodiments illustrated with accompanied drawings, wherein same or similar parts are denoted with same reference numerals. In addition, whenever possible, identical or similar reference numbers stand for identical or similar elements in the figures and the embodiments.

FIG. 1A to FIG. 1I illustrating a method of fabricating a solar cell 160 according to an exemplary embodiment of the present invention. The method is performed on a conveyer belt 130 continuously. Referring to FIG. 1A, a first surface S1 of an aluminum foil 110 is coated with a phosphorous (P) layer 120 mixed with a plurality of fine graphite powders 122. A material of the P layer 120, for instance, includes red phosphorous (rP) powders, so the P layer 120 actually contains red phosphorous and graphite powders. In the exemplary embodiment, the aluminum foil 110 is 4 microns thick (i.e. 4 micrometers), for example.

Figure 1B:
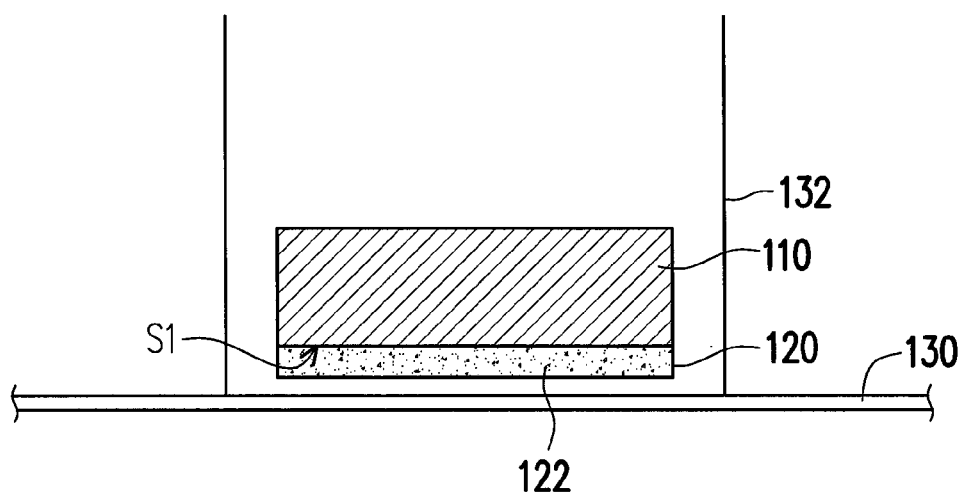

Referring to FIG. 1B, the aluminum foil 110 with the P layer 120 and the graphite powders 122 is put on a conveyer belt 130. The conveyer belt 130 may be made of graphite fiber, and a plurality of entry trays 132 is disposed on top of the conveyer belt 130. In the exemplary embodiment, the entry trays 132 are used to support the aluminum foil 110 with the P layer 120 and the graphite powders 122.

Figure 2:
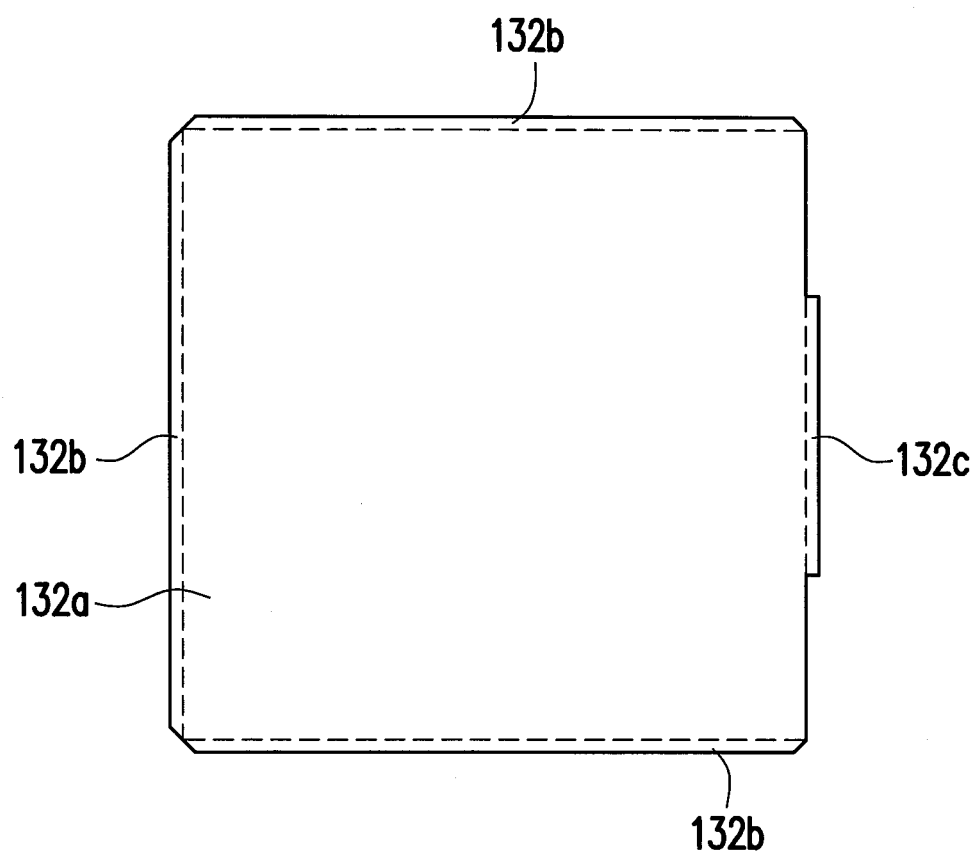
FIG. 2 is a schematic top view of the entry tray according to the exemplary embodiment of the present invention.

To be more specific, in the exemplary embodiment, the entry tray 132 is made by Tantalum (Ta) or Molybdenum (Mo) and folded from a sheet of 25 microns thick. FIG. 2 is a schematic top view of the entry tray 132 according to the exemplary embodiment. Referring to FIG. 2, the entry tray 132 includes a carrier portion 132a where the length and the width are respective 10 centimeters. In addition, the carrier portion 132a is surrounded by folded portions 132c, where the folded portion 132c are edge portions of the sheet and folded up to surround the carrier portion 132a. The folded portions 132c at three sides of the carrier portion 132 are 2 millimeters high. A lip portion 132b at one side of the carrier portion 132a is folded down towards the conveyer belt 130 in order to allow the trays to stack on top of each other. It should be noted that, the entry tray 132 shown in FIG. 2 is only an example, and the design of the entry tray 132 is not limited thereto. The entry tray 132 is coated with graphite powders. When putting the aluminum foil 110 with the P layer 120 into the entry tray 132, the first surface S1 coated with the P layer 120 mixed with the graphite powders 122 is faced to the entry tray 132 as shown in FIG. 1B.

Figure 1C:
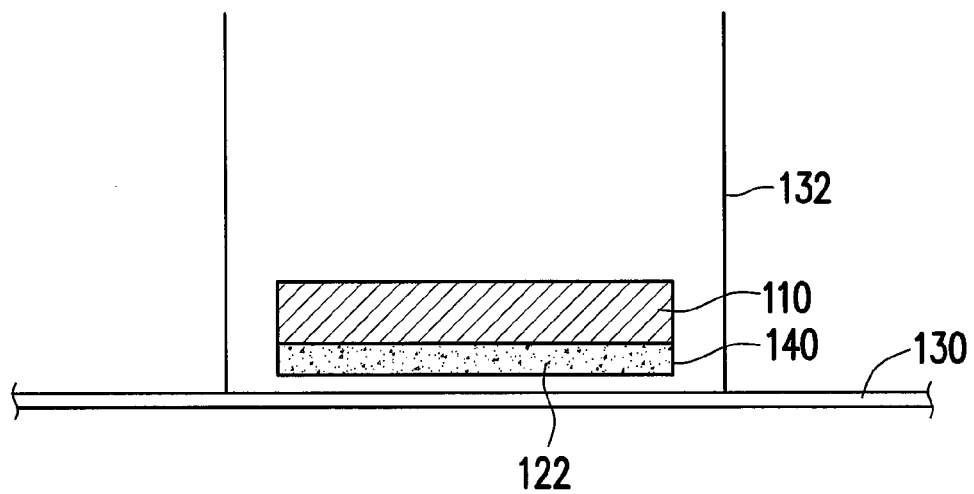

Referring to FIG. 1C, a first thermal treatment is performed to activate a portion of the aluminum foil 110 to react with the P layer 120 on the first surface S1 shown in FIG. 1B to form an aluminum phosphide (AlP) layer 140, where a portion of the aluminum foil 110 is remained on the conveyer belt 130. In the exemplary embodiment, the first thermal treatment includes heating the aluminum foil 110 and the P layer 120 shown in FIG. 1B at 300° C. When the red phosphorous is heated at 300° C., it converts to a reactive white phosphorous with vapors and reacts with the aluminum to form the aluminum phosphide. Since Aluminum phosphide (AlP) is a semiconductor material with a melting point of 2,500° C., the formation of the AlP layer 140 is also self-limiting to prevent phosphorous from diffusing through the AlP layer 140 at temperatures much below its melting point. In the exemplary embodiment, the AlP layer 140 is up to 1 micrometer thick. Further, a silicon material at elevated temperature is used as the n-dopant (in the following steps of the fabrication method), so as to from the n-type AlP layer. The n-dopant with the AlP 140, is a wide bandgap semiconductor, it forms a hetero junction barrier with the p-type poly-Si with reduced leakage current to result with a higher photovoltaic efficiency.

Figure 1D:
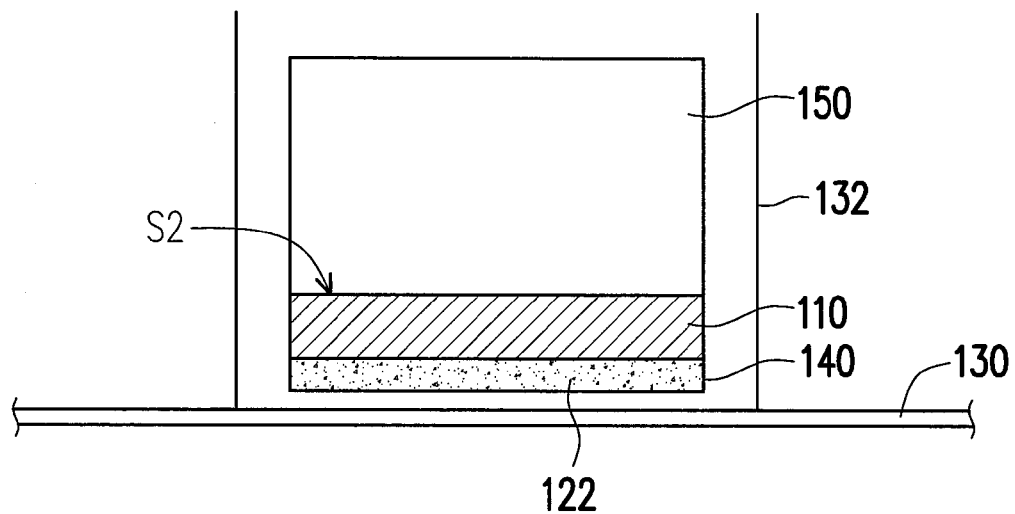

Referring to FIG. 1D, after the first thermal treatment, a molten silicon material is spray-coated on a second surface S2 of the remaining aluminum foil 110 to form a silicon layer 150, where the second surface S2 is opposite to the first surface S1 which is shown in FIG. 1A. A material of the solar grade molten silicon is piped through an induction heated Mo or Ta nozzle at 1,500° C. for example. In the exemplary embodiment, molten silicon material (for silicon layer 150) including boron (B) (not shown) are spray-coated to form a 60 micrometers thick layer, but the invention is not limited thereto.

Figure 1E:
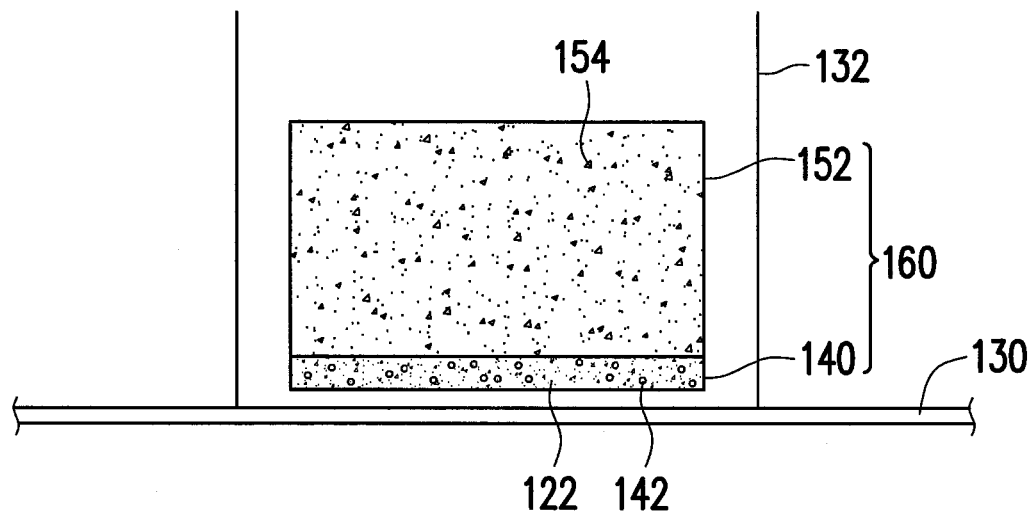

Referring to FIG. 1E, a second thermal treatment is performed to reduce the silicon grain boundaries shown in FIG. 1D and enhancing the p-type polySi layer with higher PV efficiency with the n-type wide bandgap AlP layer 140, where the remaining aluminum foil 110 (FIG. 1D) is utilized as an additional p-dopant, and the boron (not shown) is utilized as a p-dopant of the silicon layer 150 such that a solar cell 160 including the p-type polySi layer 152 and the n-type AlP 140 layer is formed on the conveyer belt 130. To form the p-type polySi layer 152 with an enhanced PV efficiency, the second thermal treatment may include several steps. However, prior to the second thermal treatment, it should be noticed that the molten silicon material with high temperature is also a kind of thermal treatment, and the remaining aluminum foil 110 (FIG. 1D) may be melted and merged into the silicon layer 150. Also, a portion of molten silicon material meeting the AlP layer 140 (FIG. 1D) generates the n-type AlP layer 140 as doped with silicon material 142 (FIG. 1E). In the second thermal treatment, the remaining aluminum foil 110 (which is still not melted by the molten silicon) is melted at 660° C. to merge into the silicon layer 150 shown in FIG. 1D as the additional p-dopant (not into the self-limiting AlP layer), and then the silicon material (silicon layer 150 in FIG. 1D) which is heated to 1,500° C. and spray-coated on the remaining aluminum foil 110 (FIG. 1D) is heated at 900° C. to anneal the p-type polySi layer 152 (FIG. 1E).

Referring to both FIG. 1D and FIG. 1E, when performing the second thermal treatment, the heating temperature is maintained at 900° C. In the exemplary embodiment, a rapid thermal pulse (RTP) method may be applied herein if necessary to heat the silicon layer 150 evenly, wherein a plurality of lamps is used for heat radiation. Within the second thermal treatment, the remaining aluminum foil 110 is melted or near melted at 660° C. due to the molten silicon material or the raised temperature in the second thermal treatment. Since the silicon material are spray-coated at the second surface S2 (silicon layer 150) of the aluminum foil 110, the aluminum 154 would merge into the silicon matrix as an additional p-dopant for silicon layer 150. Prior to the second thermal treatment, when the nozzle temperature is increased up to 1,500° C., the molten silicon are pressed to exit through the nozzle to form the silicon layer 150, and further the polySi layer 152, where the molten silicon material including boron (not shown). It should be noted that, since the melting point of the n-type AlP layer 140 is nearly 2,500° C., it would remain to be a stable substrate for carrying out the formation of p-type polySi layer 152. A portion of silicon material is merged into the AlP layer 140, and as mentioned above, the silicon material 142 (FIG. 1E) are activated as the n-dopant in the AlP layer 140 because of the elevated heating temperature. Accordingly, the solar cell 160 is formed on the conveyer belt 130 including the p-type polySi layer 152 and the n-type AlP layer 140, forming the hetero junction barrier with reduced current leakage for the PV device.

Figure 1F:
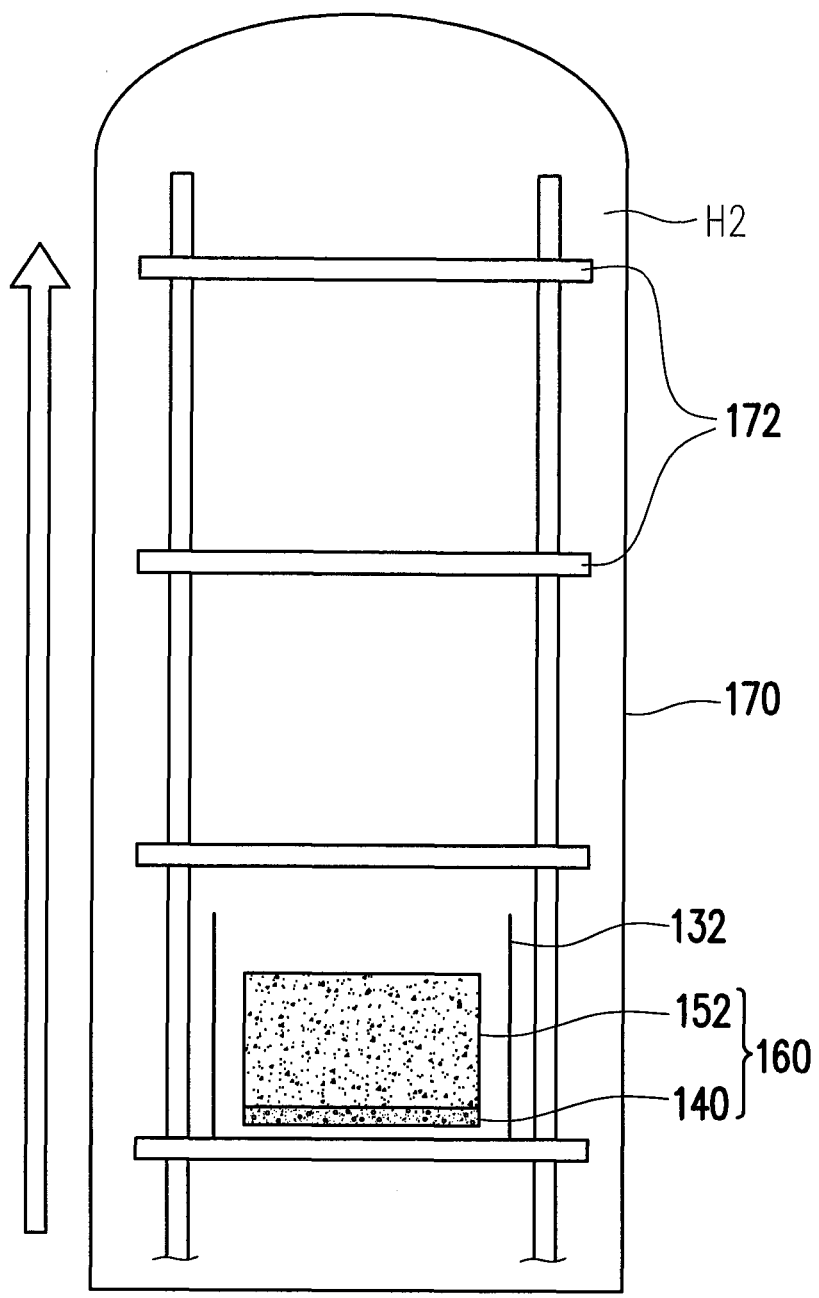

Referring to FIG. 1F, the solar cell 160 is annealed to reduce the dangling bonds of poly-crystaline defects. For example, the solar cell 160 is annealed in hydrogen (H$_2$) for passivation. In particular, the solar cell 160 is annealed in H$_2$ by entering the solar cell 160 into an annealing column 170 and ascending the solar cell 160 in a first vertical stack 172 on top of each other with hundreds of trays in the annealing column 170. The solar cell 160 is annealed at a range of 900° C.~1000° C. for several minutes. Each of the solar cells 160 enters into the annealing column 170 with the entry tray 132, and the first vertical stack 172 is ascended from bottom to top. Therefore, the continuous high throughput production of the solar cells is accomplished by this annealing step. The solar cells 160 are sequentially moved to top of the annealing column 170 and removed from the annealing column 170 at top of the column.

Figure 1G:
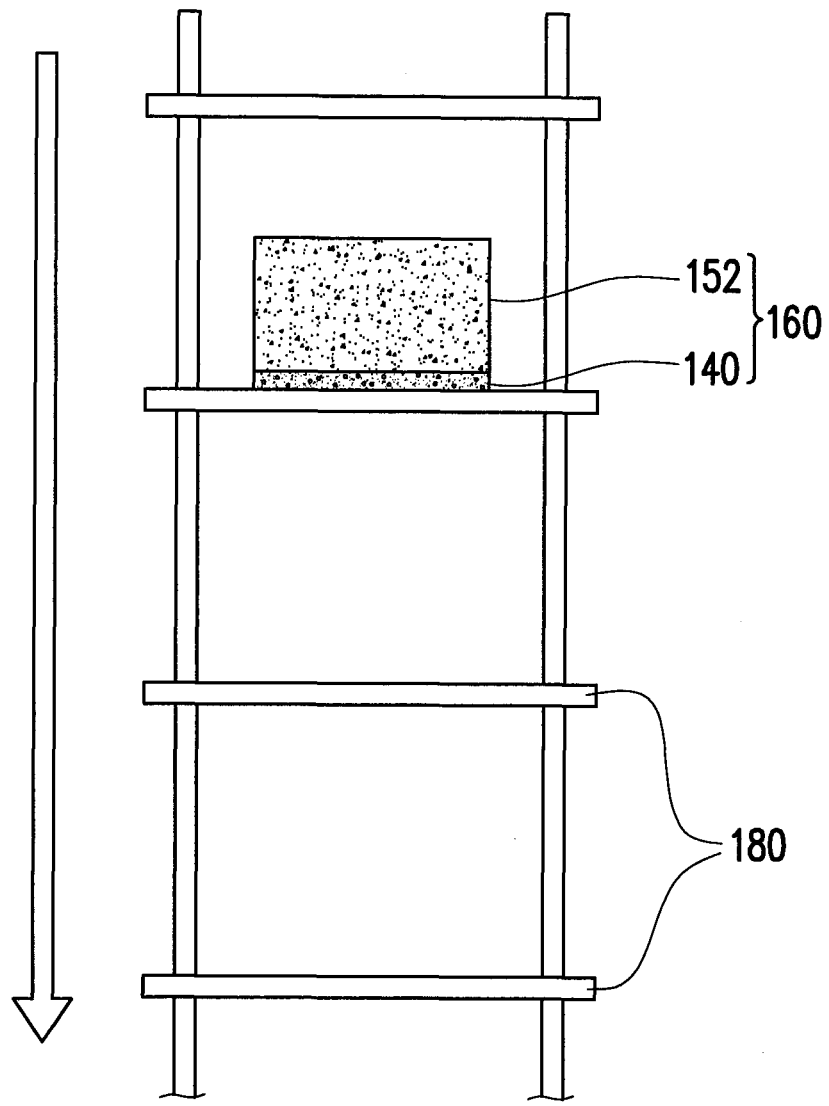

Referring to FIG. 1G, after the annealing, the solar cell 160 is transferred into a second vertical cooling stack 180 from the annealing column 170 to descend from top to bottom. It should be noted that, the cooling column 180 consists of several different temperature zones from which the solar cell 160 could be removed from the entry tray 132 to undergo tasks at the desired temperature as an integral part of the fabrication process. The entry tray 132 is reusable, so the entry tray 132 is coated with the graphite powders again and moved by the conveyer belt 130 for producing another solar cell 160. Since the solar cell 160 exists from top of the annealing column 170, a second vertical stack 180 which is moving from top to bottom with the solar cell 160 downward to the lower level. While the second vertical stack 180 is descending, the solar cell 160 is cooled down, for instance, from 500° C. to 200° C. where in the digital electrodes may be transferred, the glass may be bonded and sealed, and the metal back maybe attached to.

A PN hetero junction is formed at the boundary between the n-type AlP layer 140 and the p-type polySi layer 152 PN junction barrier creates positive and negative fields from the said barrier. When the light is absorbed by the semiconductor with a PN hetero-junction, electrons and holes are created, the free holes generated by the light deep in the p-type polySi layer 152 are pushed by the barrier field toward the metal connecting polySi layer 152, while the electrons are pushed by the barrier field toward the digital electrode on top of the n-type AlP layer 140. As the result, the solar cell 160 is capable of providing electrical power.

Figure 1H:
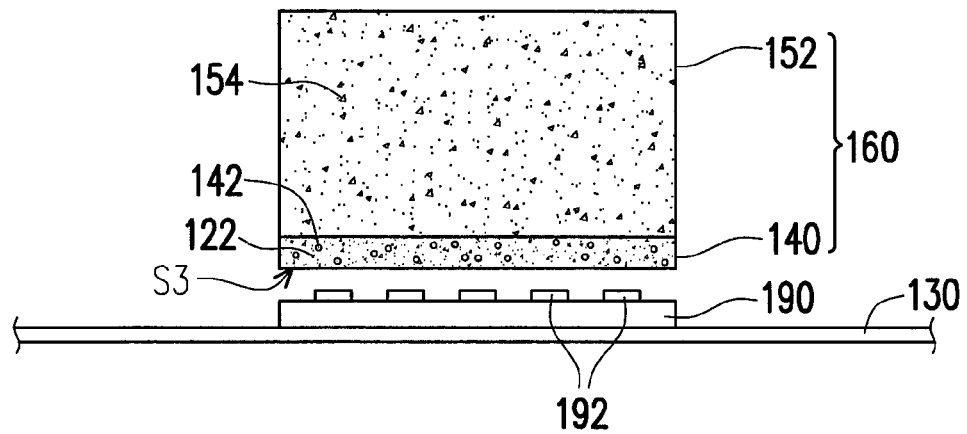

However, the method of fabricating the solar cell 160 further includes several steps. Referring to FIG. 1H, a plurality of digital electrodes 192 is attached to an exposed surface S3 of the n-type AlP layer 140 after moving the solar cell 160 out the second vertical stack 180 in FIG. 1G. The digital electrodes 192 may directly contact with the n-type AlP layer 140 to allow electron charges to be driven to a negative contact and the p-polySi with metal back to the positive contact enter a circuit coupled to the solar cell 160. A material of the digital electrodes 192 includes, for example, nickel, or conductive ink-jet printing material and the digital electrodes 192 may be stripes arranged in parallel form, but the invention is not limited thereto. To attach the digital electrodes 192 to the n-type AlP layer 140, the digital electrodes 192 are imprinted on a separable waxy surface 190, for example. The solar cell 160 in the cooling stack is continuously cooled down from 900° C., the varied temperatures could be utilized, for example, to attach the digital electrodes 192 from easily released separable waxy surface 190, and followed by bonding glass to the exposed surface S3 of the n-type AlP layer 140. The digital electrodes 192 with the separable waxy surface 190 may be disposed on the conveyer belt 130, and the solar cell 160 having the exposed surface S3 facing down could directly be put on the separable waxy surface 190 for attaching the digital electrodes 192 and the bonding glass 194.

Figure 1I:
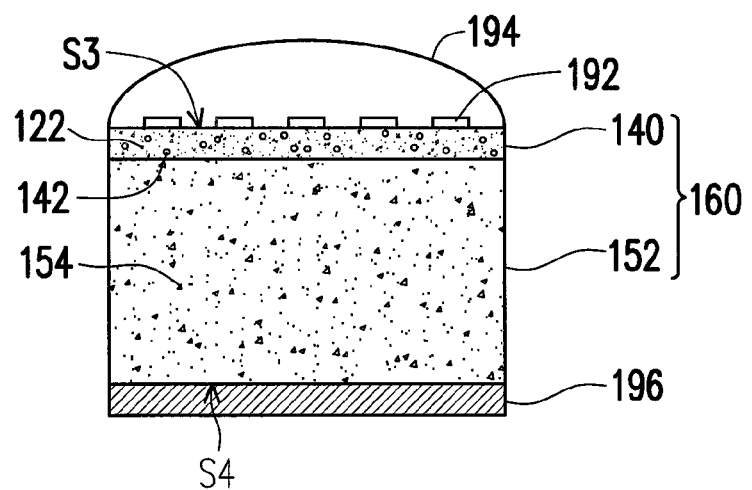

Referring to FIG. 1I, the digital electrodes 192 and the n-type AlP layer 140 are sealed by a bonding glass 194. The bonding glass 194 may be utilized for protecting the solar cell 160 and designed for collecting light to generate electrical power. Further, a reflective metal back layer 196 is added to an exposed surface S4 of the p-type polySi layer 152. The reflective metal back layer 190 is also disposed as a back layer electrode for positive charges, and a material of the reflective metal back layer includes, for example, aluminum layer, all housed in a stainless steel or aluminum alloy well with depth of 0.1 mm (not shown) that could easily be coupled with a flat glass in order to keep out moisture, for example.

Although the method of fabricating the solar cell is outlined above, a detailed practice is shown below as an exemplary embodiment. A 10 centimeters wide conveyer belt carrying a plurality of entry trays which is 10 centimeters wide and 10 centimeters long. These trays are advanced for half second and stopped for one second repeatedly by moving and holding the conveyer belt. Each of steps described above is performed to fabricate the solar cell when the conveyer belt is stop. Ideally, each of steps is preformed up to 21 million times in a year, so as to produce 21 millions solar cells at 10 centimeters by 10 centimeters each. Furthermore, a solar cell which is at 10 centimeters by 10 centimeters could be cut or slice into smaller pieces depending on the application requirement.

Based on above, the method of fabricating the solar cell is performed on the conveyer belt continuously, and the solar cell is formed layer-by-layer in the entry tray. The method applies the first thermal treatment and the second thermal treatment rather than cutting, polishing and implanting dopant materials to form the semiconductor layers (n-type AlP layer and p-type polySi layer), so as to sufficiently utilize the materials in a continuous integrated process and save the costs with respect to waste in time, material, and use of equipments.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A method of fabricating a solar cell on a conveyer belt, comprising:
    coating a first surface of an aluminum foil with a phosphorous (P) layer mixed with a plurality of graphite powders;
    putting the aluminum foil with the phosphorous layer and graphite powders on the conveyer belt;
    performing a first thermal treatment to activate a portion of the aluminum foil and the P layer on the first surface to form an aluminum phosphide (AlP) layer, wherein a portion of the aluminum foil is remained on the conveyer belt;
    spray-coating a molten silicon material on a second surface of the remaining aluminum foil, wherein the second surface is opposite to the first surface, and a portion of the molten silicon material meeting AlP to form an n-type AlP layer, wherein the molten silicon material comprises boron (B);
    performing a second thermal treatment to distribute the molten silicon material as a p-type polySi layer on the n-type AlP layer, wherein the remaining aluminum foil is utilized as an additional p-dopant of a silicon matrix, and the boron is utilized as a p-dopant such that a solar cell including the p-type polySi layer and the n-type AlP layer is formed on the conveyer belt;
    annealing the solar cell in hydrogen by entering the solar cell into an annealing column and ascending the solar cell in a first vertical stack in the annealing column; and
    transferring the solar cell from the annealing column into a second vertical stack to descend from top to bottom.

2. The method of fabricating a solar cell as claimed in claim 1, wherein the step of putting the aluminum foil with the phosphorous layer and the graphite powders on the conveyer belt comprises using an entry tray to support the aluminum foil on the conveyer belt, and the solar cell is formed in the entry tray.

3. The method of fabricating a solar cell as claimed in claim 2, wherein the entry tray is coated with a plurality of graphite powders, and the first surface coated with the phosphorous layer mixed with the graphite powders is faced to the entry tray.

4. The method of fabricating a solar cell as claimed in claim 1, wherein the first thermal treatment comprises heating the aluminum foil and the P layer at 300° C.

5. The method of fabricating a solar cell as claimed in claim 1, wherein a silicon material is heated to 1,500° C. as the molten silicon material, and the molten silicon material is spray-coated on the second surface of the aluminum layer before entering the second thermal treatment, the second thermal treatment comprises:
    melting the remaining aluminum foil at 660° C. to merge into the silicon matrix as an additional p-dopant; and
    heating the spray-coated silicon material at 900° C. to anneal the p-type polySi layer.

6. The method of fabricating a solar cell as claimed in claim 1, wherein the n-type AlP layer is formed by using the silicon as an n-dopant.

7. The method of fabricating a solar cell as claimed in claim 1, wherein a material of the AlP layer comprises red phosphorous powders.

8. The method of fabricating a solar cell as claimed in claim 1, wherein the step of annealing the solar cell is performed at a range of 900° C.-1000° C.

9. The method of fabricating a solar cell as claimed in claim 1, wherein after the step of transferring the solar cell from the annealing column into the second vertical stack further comprises:
    attaching a plurality of digital electrodes to a exposed surface of the n-type AlP layer; and
    sealing the digital electrodes and the n-type AlP layer with a bonding glass.

10. The method of fabricating a solar cell as claimed in claim 9, wherein the digital electrodes are imprinted on a separable waxy surface.

11. The method of fabricating a solar cell as claimed in claim 10, wherein digital electrodes are formed by a conductive ink in an ink-jet printing material which is printed on the separable waxy surface.

12. The method of fabricating a solar cell as claimed in claim 9, wherein a material of the digital electrodes comprises nickel.

13. The method of fabricating a solar cell as claimed in claim 9, wherein after the step of sealing the digital electrodes and the n-type AlP layer further comprises adding a reflective metal back layer to an exposed surface of the p-type polySi layer.

14. The method of fabricating a solar cell as claimed in claim 13, wherein the reflective metal back layer comprises an aluminum layer.

15. The method of fabricating a solar cell as claimed in claim 14, wherein the solar cell is sealed in a stainless steel or an aluminium alloy well covered by a flat bonding glass.

* * * * *